(12) United States Patent
Tsushima et al.

(10) Patent No.: US 12,399,237 B2
(45) Date of Patent: Aug. 26, 2025

(54) MAGNETIC SENSOR AND MAGNETIC DETECTION SYSTEM

(71) Applicant: Panasonic Intellectual Property Management Co., Ltd., Osaka (JP)

(72) Inventors: Takafumi Tsushima, Osaka (JP); Kazuhiro Onaka, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 151 days.

(21) Appl. No.: 18/561,565

(22) PCT Filed: May 16, 2022

(86) PCT No.: PCT/JP2022/020401
§ 371 (c)(1),
(2) Date: Nov. 16, 2023

(87) PCT Pub. No.: WO2022/244734
PCT Pub. Date: Nov. 24, 2022

(65) Prior Publication Data
US 2024/0248157 A1  Jul. 25, 2024

(30) Foreign Application Priority Data

May 17, 2021  (JP) .................. 2021-083385

(51) Int. Cl.
*G01R 33/09*  (2006.01)
*H10N 50/85*  (2023.01)
*H10N 50/10*  (2023.01)

(52) U.S. Cl.
CPC .......... *G01R 33/093* (2013.01); *H10N 50/85* (2023.02); *H10N 50/10* (2023.02)

(58) Field of Classification Search
CPC .................................. G01R 33/093
See application file for complete search history.

(56) References Cited

U.S. PATENT DOCUMENTS 11,287,490 B2 *  3/2022  Deak ............... G01R 33/098
2012/0319221 A1  12/2012  Apalkov et al.
(Continued)

FOREIGN PATENT DOCUMENTS

JP  2002-303536 A  10/2002
JP  2012-037463 A  2/2012
(Continued)

OTHER PUBLICATIONS

International Search Report dated Jun. 21, 2022 issued in International Patent Application No. PCT/JP2022/020401, with English translation.

*Primary Examiner* — Alesa Allgood
(74) *Attorney, Agent, or Firm* — Rimon P.C.

(57) ABSTRACT

A magnetic sensor includes at least one bias magnet, a first half-bridge circuit, a second half-bridge circuit, and a base member. The first half-bridge circuit includes a pair of first magnetoresistive effect elements to one of which a bias magnetic field aligned with a positive direction of an X-axis is applied and to the other of which a bias magnetic field aligned with a negative direction of the X-axis is applied. The second half-bridge circuit includes a pair of second magnetoresistive effect elements to one of which a bias magnetic field aligned with a positive direction of a Y-axis is applied and to the other of which a bias magnetic field aligned with a negative direction of the Y-axis is applied.

8 Claims, 8 Drawing Sheets

(56) References Cited

U.S. PATENT DOCUMENTS

2016/0282145 A1 9/2016 Ueda et al.
2018/0238711 A1 8/2018 Zimmer
2018/0335483 A1 11/2018 Takaki et al.
2020/0041310 A1 2/2020 Lassalle-Baller et al.

FOREIGN PATENT DOCUMENTS

| JP | 2014-149268 A | 8/2014 |
| JP | 2014-153054 A | 8/2014 |
| JP | 2016-186476 A | 10/2016 |
| JP | 2018-107280 A | 7/2018 |
| JP | 2018-179776 A | 11/2018 |
| WO | 2016/080470 A1 | 5/2016 |

* cited by examiner

MAGNETIC SENSOR AND MAGNETIC DETECTION SYSTEM

This application is the U.S. National Phase under 35 U.S.C. § 371 of International Patent Application No. PCT/JP2022/020401, filed on May 16, 2022, which in turn claims the benefit of Japanese Patent Application No. 2021-083385, filed on May 17, 2021, the entire disclosures of which Applications are incorporated by reference herein.

TECHNICAL FIELD

The present disclosure generally relates to magnetic sensors and magnetic detection systems and specifically relates to a magnetic sensor, including at least one bias magnet, and a magnetic detection system.

BACKGROUND ART

Patent Literature 1 describes a rotational angle determining sensor (magnetic sensor) configured as explained below. At least two pairs of GMR elements each having a free magnetic layer and a pinning magnetic layer are disposed on a substrate. The GMR elements in each pair are connected to each other in series, a rotatably magnet is disposed to face the GMR elements, and this magnet applies a saturated magnetic field to the GMR elements. A change in resistance values of the GMR elements caused due to an angle formed between an orientation of magnetization of the free magnetic layer following an orientation of a magnetic field line of a magnet and a direction of magnetization of the pinning magnetic layer determines a rotational angle of a rotational axis of the magnet.

CITATION LIST

Patent Literature

Patent Literature 1: JP 2002-303536 A

SUMMARY OF INVENTION

An object of the present disclosure is to provide a magnetic sensor and a magnetic detection system, each contributing to more accurately detecting the orientation of a magnetic field applied to a magnetic sensor.

A magnetic sensor according to an aspect of the present disclosure includes at least one bias magnet, a first half-bridge circuit, a second half-bridge circuit, and a base member. The at least one bias magnet is configured to generate a bias magnetic field aligned with a positive direction of an X-axis, a bias magnetic field aligned with a negative direction of the X-axis, a bias magnetic field aligned with a positive direction of a Y-axis orthogonal to the X-axis, and a bias magnetic field aligned with a negative direction of the Y-axis. The base member holds the at least one bias magnet, the first half-bridge circuit, and the second half-bridge circuit. The first half-bridge circuit includes a pair of first magnetoresistive effect elements half-bridge connected to each other and configured to detect a magnetic field aligned with the X-axis and a first output terminal configured to output a first output signal from a connection point between the pair of first magnetoresistive effect elements. The second half-bridge circuit includes a pair of second magnetoresistive effect elements half-bridge connected to each other and configured to detect a magnetic field aligned with the Y-axis and a second output terminal configured to output a second output signal from a connection point between the pair of second magnetoresistive effect elements. The bias magnetic field aligned with the positive direction of the X-axis is applied to one of the pair of first magnetoresistive effect elements, and the bias magnetic field aligned with the negative direction of the X-axis is applied to the other of the pair of first magnetoresistive effect elements. The bias magnetic field aligned with the positive direction of the Y-axis is applied to one of the pair of second magnetoresistive effect elements, and the bias magnetic field aligned with the negative direction of the Y-axis is applied to the other of the pair of second magnetoresistive effect elements.

A magnetic detection system according to another aspect of the present disclosure includes the magnetic sensor described above and a processing circuit. The processing circuit determines, based on at least the first output signal and the second output signal, an orientation of a magnetic field applied to the magnetic sensor.

DESCRIPTION OF EMBODIMENTS

A magnetic sensor and magnetic detection system according to an embodiment will be described with reference to the accompanying drawings. Note that the embodiment to be described below is only an exemplary one of various embodiments of the present disclosure and should not be construed as limiting. Rather, the embodiment which will be described below may be readily modified in various manners depending on a design choice or any other factor without departing from the scope of the present disclosure. The drawings to be referred to in the following description of embodiments are all schematic representations. Thus, the ratio of the dimensions (including thicknesses) of respective constituent elements illustrated on the drawings does not always reflect their actual dimensional ratio.

(Overview)

Figure 1:
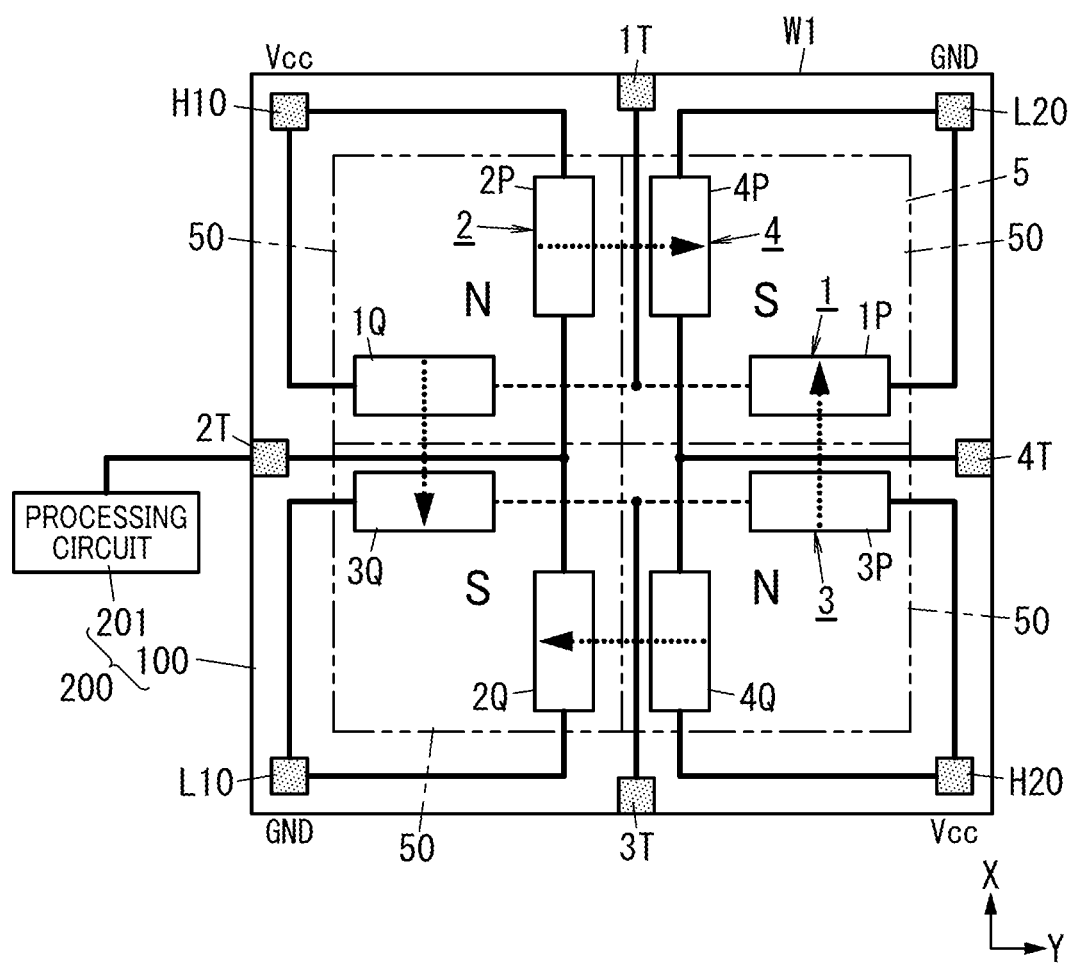
FIG. 1 is a plan view of a magnetic sensor according to an embodiment.
Figure 3:
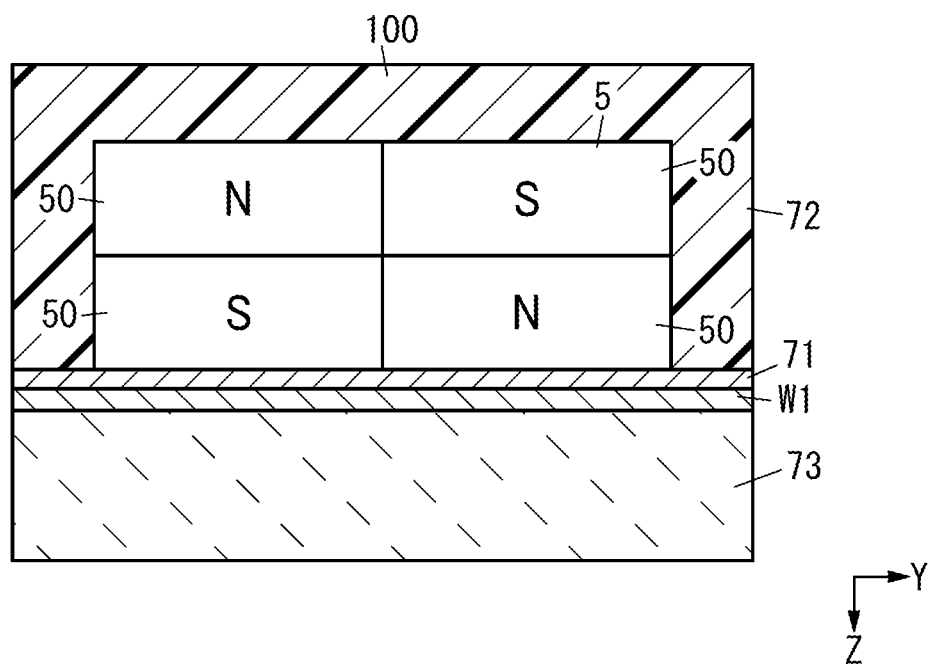
FIG. 3 is a sectional view of the magnetic sensor.

As shown in FIG. 1, a magnetic sensor 100 of the present embodiment includes at least one bias magnet 5, a first half-bridge circuit 1, a second half-bridge circuit 2, and a base member 73 (see FIG. 3). The at least one bias magnet 5 generates a bias magnetic field aligned with a positive direction of an X-axis, a bias magnetic field aligned with a negative direction of the X-axis, a bias magnetic field aligned with a positive direction of a Y-axis orthogonal to the X-axis, and a bias magnetic field aligned with a negative direction of the Y-axis. The base member 73 holds the at least one bias magnet 5, the first half-bridge circuit 1, and the second half-bridge circuit 2. The first half-bridge circuit 1 includes: a pair of first magnetoresistive effect elements 1P and 1Q half-bridge connected to each other and configured to detect a magnetic field aligned with the X-axis; and a first output terminal 1T configured to output a first output signal from a connection point between the pair of first magnetoresistive effect elements 1P and 1Q. The second half-bridge circuit 2 includes; a pair of second magnetoresistive effect elements 2P and 2Q half-bridge connected to each other and configured to detect a magnetic field aligned with the Y-axis; and a second output terminal 2T configured to output a second output signal from a connection point between the pair of second magnetoresistive effect elements 2P and 2Q. The bias magnetic field aligned with the positive direction of the X-axis is applied to one of the pair of first magnetoresistive effect elements 1P and 1Q, and the bias magnetic field aligned with the negative direction of the X-axis is applied to the other of the pair of first magnetoresistive effect elements 1P and 1Q. The bias magnetic field aligned with the positive direction of the Y-axis is applied to one of the pair of second magnetoresistive effect elements 2P and 2Q, and the bias magnetic field aligned with the negative direction of the Y-axis is applied to the other of the pair of second magnetoresistive effect elements 2P and 2Q.

This embodiment causes the first output signal delivered as the magnetic field applied to the magnetic sensor 100 rotates to have a waveform close to an ideal sinusoidal wave and causes the second output signal to have a waveform close to an ideal cosine wave. This enables accurately determining, based on the first output signal and the second output signal, the orientation of the magnetic field applied to the magnetic sensor 100.

Moreover, the first half-bridge circuit 1 and the second half-bridge circuit 2 are aggregated together in the base member 73. This saves the trouble of adjusting the positional relationship between the first base member and the second base member, compared to a situation where a first base member on which the first half-bridge circuit 1 is mounted and a second base member on which the second half-bridge circuit 2 is mounted are individually disposed. In addition, this also reduces the chances of a change in positional relation causing a decline in the accuracy of the orientation of the magnetic field detected.

To say that the direction of the bias magnetic field or the detection direction of a magnetic field by the magnetoresistive effect element is aligned with the X-axis or the Y-axis, the angular difference between the direction and the axis is preferably less than or equal to 5 degrees.

In the following description, a Z-axis, which is an axis perpendicular to both the X-axis and the Y-axis, will be used along with the X-axis and the Y-axis. Note that each of the X-axis, the Y-axis, and the Z-axis is a virtual axis defined on the magnetic sensor 100 and is an insubstantial one.

(Details)
(1) Overall Configuration

Figure 2:
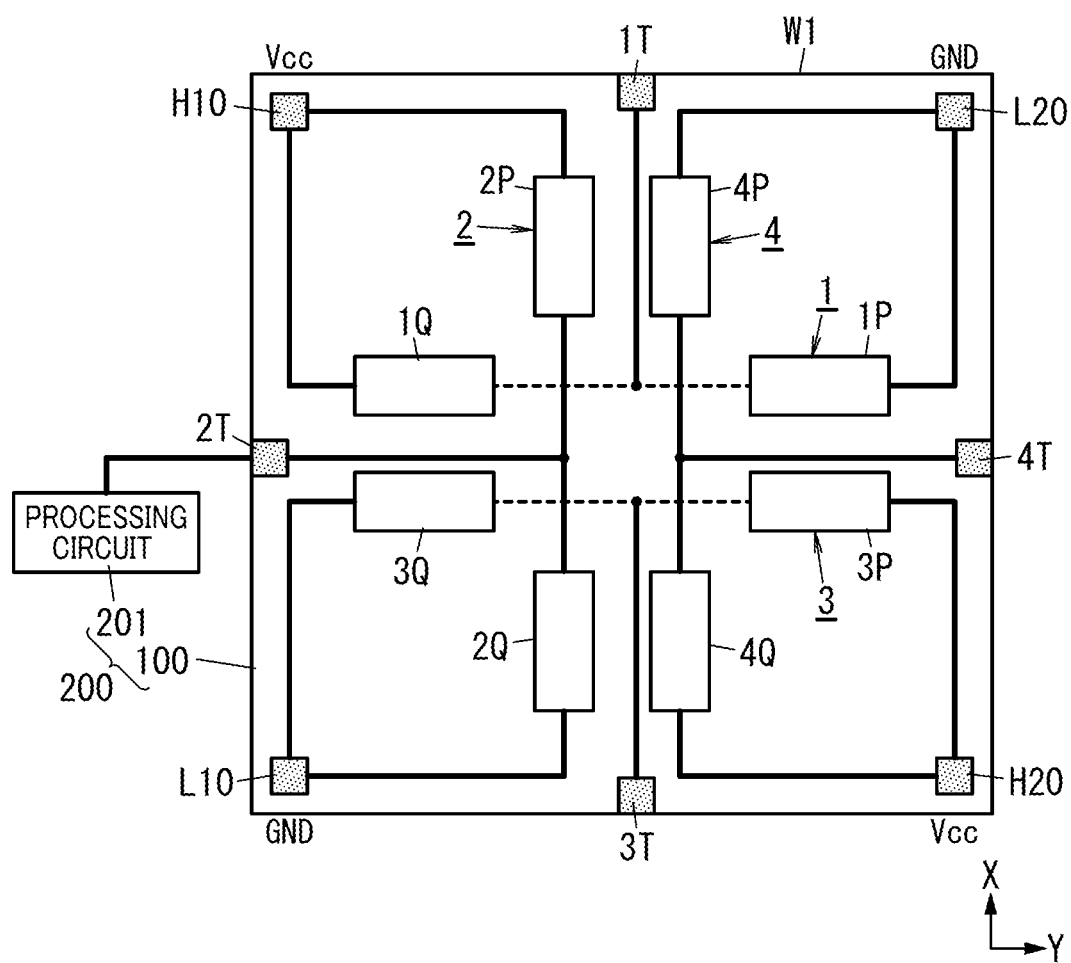
FIG. 2 is a plan view of the magnetic sensor, in which a bias magnet is omitted.

As shown inf FIGS. 1 to 3, the magnetic sensor 100 includes a second protection film 72, the bias magnet 5, a first protection film 71, a wiring layer W1, and the base member 73. The wiring layer W1 includes a first half-bridge circuit 1, the second half-bridge circuit 2, a third half-bridge circuit 3, and a fourth half-bridge circuit 4. Note that in FIG. 1, only the wiring layer W1 and the bias magnet 5 are shown, and in FIG. 2, only the wiring layer W1 is shown.

A magnetic detection system 200 includes the magnetic sensor 100 and a processing circuit 201. The processing circuit 201 determines, based on at least the first output signal and the second output signal, the orientation of a magnetic field applied to the magnetic sensor 100.

In the following description of the embodiment, the magnetic sensor 100 and the magnetic detection system 200 are supposed to be used to determine the orientation of a magnetic field generated from a rotor 8 (refer to FIG. 4) of a motor and thereby determine the rotational angle of the rotor 8.

(2) Rotor

Figure 4:
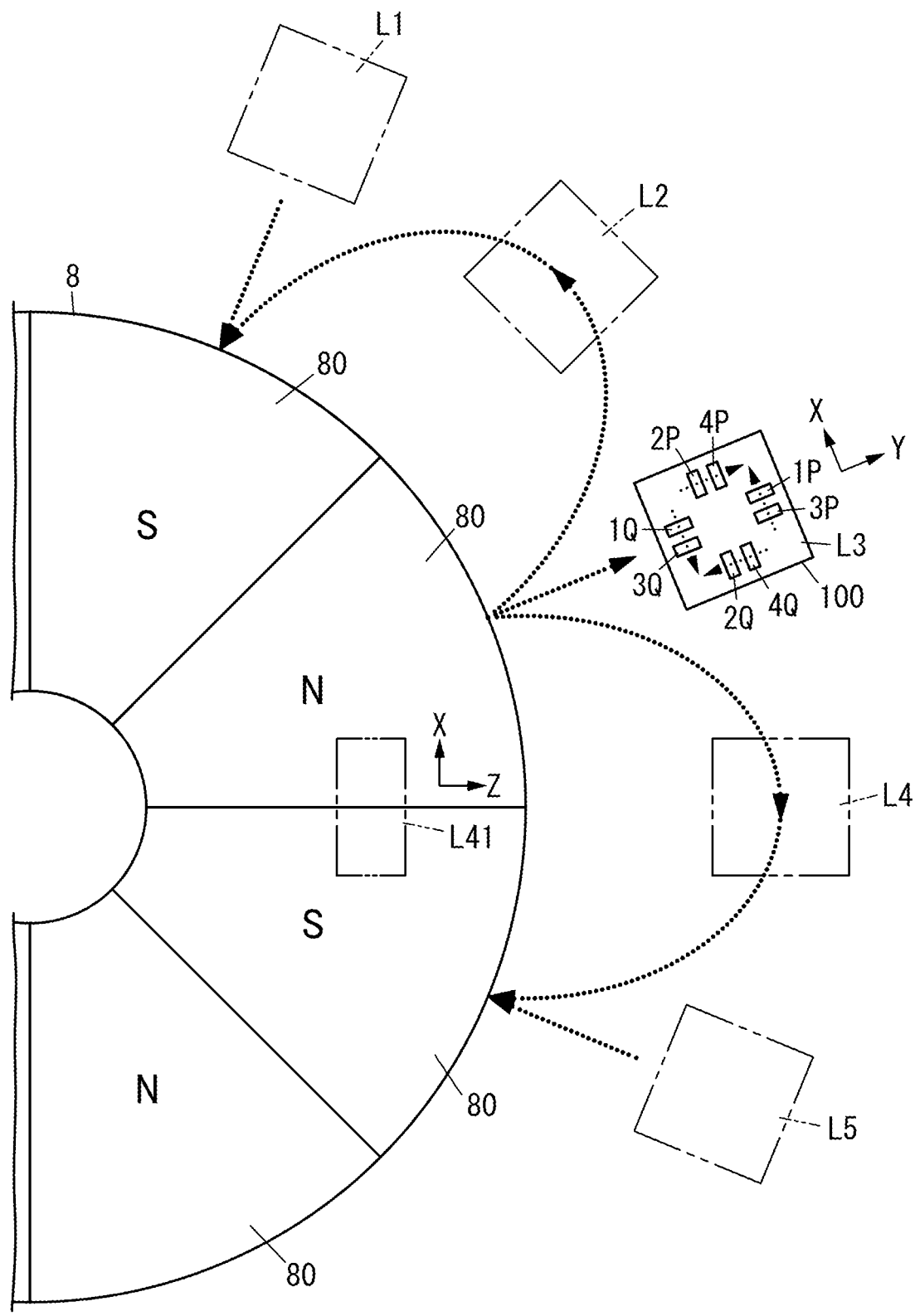
FIG. 4 is a schematic diagram illustrating how the magnetic sensor may be used.

The rotor 8 includes a plurality of permanent magnets. The plurality of permanent magnets form a plurality of magnetic poles 80. In other words, the plurality of permanent magnets have the plurality of magnetic poles 80. The plurality of magnetic poles 80 are arranged side by side in the rotational direction of the rotor 8 such that N-poles and S-poles are alternately arranged. In FIG. 4, the plurality of magnetic poles 80 are arranged side by side such that the N- and S-poles alternate with each other every 45 degrees in the rotational direction of the rotor 8. In FIG. 4, each of the magnetic poles 80 is labeled as either "N" indicating that the magnetic pole 80 is an N-pole or "S" indicating that the magnetic pole 80 is an S-pole. Note that the letters "N" and "S" are shown on the drawings for illustrative purposes only and actually the magnetic poles 80 do not have such inscribed letters. In FIGS. 1 and 3, the same applies to "N" and "S" shown on the bias magnet 5.

(3) Bias Magnet

As shown in FIGS. 1 and 3, the bias magnet 5 is in the shape of a rectangular parallelepiped. The bias magnet 5 is a single member. As the bias magnet 5, for example, a permanent magnet or an electromagnet may be employed. The bias magnet 5 of the present embodiment is a permanent magnet. The bias magnet 5 is, for example, a ferrite magnet or a neodymium magnet.

The bias magnet 5 includes a plurality of (in the present embodiment, eight) magnetic poles 50. Four magnetic poles 50 of the eight magnetic poles 50 are disposed on a first plane parallel to both the X-axis and the Y-axis. The remaining four magnetic poles 50 of the eight magnetic poles 50 are disposed on a second plane parallel to the first plane.

That is, two groups each including four magnetic poles 50 are disposed. In each group, the four magnetic poles 50 are on the same plane. The magnetic poles 50 belonging to different groups are disposed at different positions in a Z-axis direction. A Z coordinate of each of the four magnetic poles 50 shown in FIG. 1 is greater than a Z coordinate of each of the remaining four magnetic poles 50.

The eight magnetic poles 50 are disposed such that the magnetic poles 50 adjacent to each other in an X-axis direction have different poles and the magnetic pole 50 adjacent to each other in a Y-axis direction have different poles. Moreover, the eight magnetic poles 50 are disposed such that the magnetic poles 50 adjacent to each other in the Z-axis direction have different poles.

(4) Base Member

As shown in FIG. 3, the base member 73 has a plate shape. The base member 73 is, for example, an alumina substrate.

(5) Wiring Layer

As shown in FIG. 3, the wiring layer W1 is formed on a surface of the base member 73. Thus, the base member 73 holds the wiring layer W1.

The wiring layer W1 of the present embodiment includes, for example, a plurality of layers. The plurality of layers are electrically connected to each other via a through hole.

As shown in FIG. 2, the wiring layer W1 includes the first half-bridge circuit 1, the second half-bridge circuit 2, the third half-bridge circuit 3, and the fourth half-bridge circuit 4.

The first half-bridge circuit 1 includes the pair of first magnetoresistive effect elements 1P and 1Q and the first output terminal 1T.

The second half-bridge circuit 2 includes the pair of second magnetoresistive effect elements 2P and 2Q and the second output terminal 2T.

Figure 5:
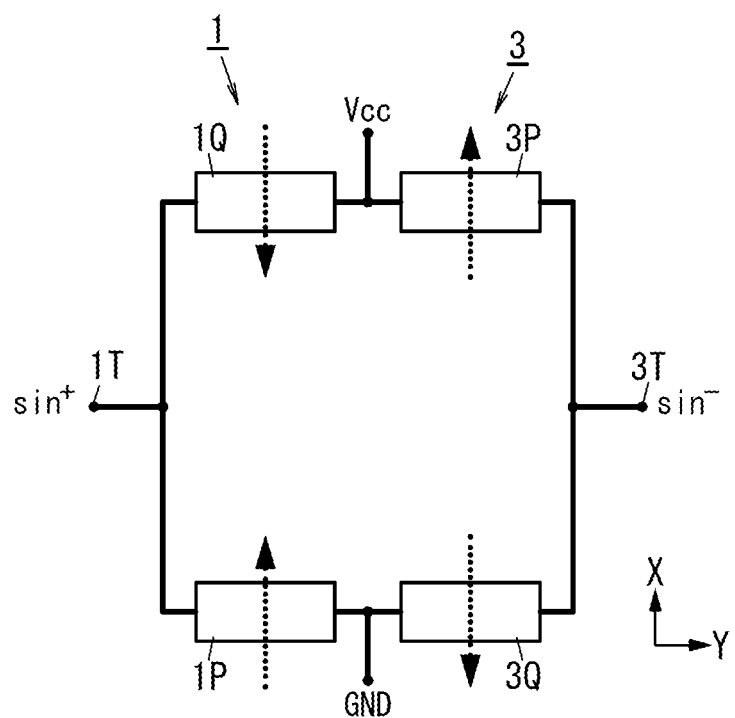
FIG. 5 is an equivalent circuit diagram of a first half-bridge circuit and a third half-bridge circuit of the magnetic sensor.

As shown in FIG. 5, the third half-bridge circuit 3 includes a pair of third magnetoresistive effect elements 3P and 3Q and a third output terminal 3T. The pair of third magnetoresistive effect elements 3P and 3Q are half-bridge connected to each other. The pair of third magnetoresistive effect elements 3P and 3Q detect a magnetic field aligned with the X-axis. The third output terminal 3T outputs a third output signal from a connection point between the pair of third magnetoresistive effect elements 3P and 3Q.

Figure 6:
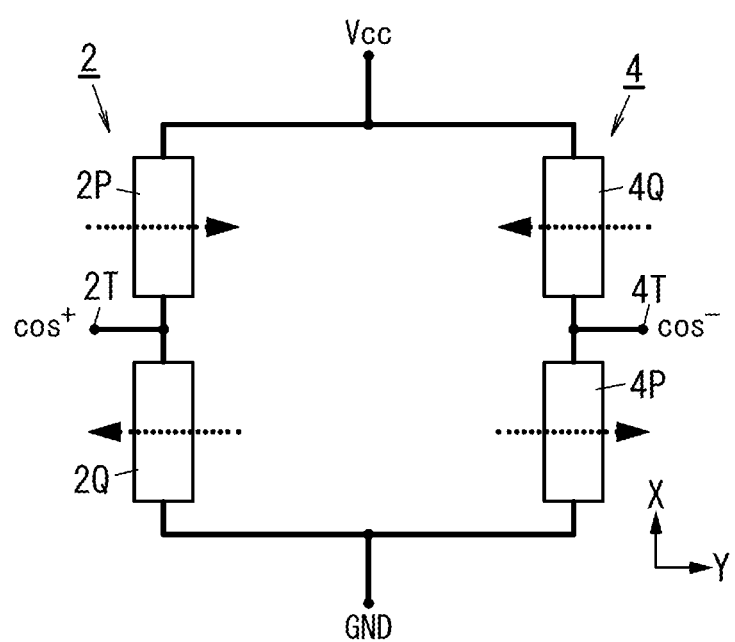
FIG. 6 is an equivalent circuit diagram of a second half-bridge circuit and a fourth half-bridge circuit of the magnetic sensor.

As shown in FIG. 6, the fourth half-bridge circuit 4 includes a pair of fourth magnetoresistive effect elements 4P and 4Q and a fourth output terminal 4T. The pair of fourth magnetoresistive effect elements 4P and 4Q are half-bridge connected to each other. The pair of fourth magnetoresistive effect elements 4P and 4Q detect a magnetic field aligned with the Y-axis. The fourth output terminal 4T outputs a fourth output signal from a connection point between the pair of fourth magnetoresistive effect elements 4P and 4Q.

In the following description, each of the first magnetoresistive effect elements 1P and 1Q, the second magnetoresistive effect elements 2P and 2Q, the third magnetoresistive effect elements 3P and 3Q, and the fourth magnetoresistive effect elements 4P and 4Q will sometimes be referred to as a magnetoresistive effect element Mr0. That is, the magnetic sensor 100 includes a plurality of (eight) magnetoresistive effect elements Mr0.

As shown in FIG. 2, the wiring layer W1 further includes power supply terminals H10 and H20 and reference terminals L10 and L20. The power supply terminals H10 and H20 are higher-potential terminals electrically connected to a higher-potential electrical path of a power supply. The reference terminals L10 and L20 are lower-potential terminals electrically connected to a lower-potential electrical path (electrical path of a reference potential) of the power supply. In the present embodiment, the reference terminals L10 and L20 are grounding terminals electrically connected an electrical path of a ground potential.

The first magnetoresistive effect element 1P has a first terminal electrically connected to the reference terminal L20. The first magnetoresistive effect element 1P has a second terminal electrically connected to a first terminal of the first magnetoresistive effect element 1Q. The first magnetoresistive effect element 1Q has a second terminal electrically connected to the power supply terminal H10. The first output terminal 1T is electrically connected to the connection point between the pair of first magnetoresistive effect elements 1P and 1Q.

The second magnetoresistive effect element 2P has a first terminal electrically connected to the power supply terminal H10. The second magnetoresistive effect element 2P has a second terminal electrically connected to a first terminal of the second magnetoresistive effect element 2Q. The second magnetoresistive effect element 2Q has a second terminal electrically connected to the reference terminal L10. The second output terminal 2T is electrically connected to the connection point between the pair of second magnetoresistive effect elements 2P and 2Q.

The third magnetoresistive effect element 3P has a first terminal electrically connected to a power supply terminal H20. The third magnetoresistive effect element 3P has a second terminal electrically connected a first terminal of the third magnetoresistive effect element 3Q. The third magnetoresistive effect element 3Q has a second terminal electrically connected the reference terminal L10. The third output terminal 3T is electrically connected the connection point between the pair of third magnetoresistive effect elements 3P and 3Q.

The fourth magnetoresistive effect element 4P has a first terminal electrically connected to the reference terminal L20. The fourth magnetoresistive effect element 4P has a second terminal electrically connected a first terminal of the fourth magnetoresistive effect element 4Q. The fourth magnetoresistive effect element 4Q has a second terminal electrically connected to the power supply terminal H20. The fourth output terminal 4T is electrically connected to the connection point between the pair of fourth magnetoresistive effect elements 4P and 4Q.

The first output terminal 1T, the second output terminal 2T, the third output terminal 3T, and the fourth output terminal 4T are electrically connected the processing circuit 201. Note that in FIGS. 1 and 2, only the first output terminal 1T is connected to the processing circuit 201 for simplification.

In FIGS. 1, 2, 4, 5, and 6, the shape of each magnetoresistive effect element Mr0 is rectangular when viewed in the Z-axis direction. However, this shape is schematically drawn to show the orientation of the magnetoresistive effect element Mr0 and does not correspond to the actual shape of the magnetoresistive effect element Mr0.

The magnetoresistive effect element Mr0 has an electrical resistance value that varies according to the magnitude of a magnetic field applied. The magnetic sensor 100 outputs, as a voltage signal, the variation in the electrical resistance value of the magnetoresistive effect element Mr0. The magnetoresistive effect element Mr0 has no sensitivity to a magnetic field in a first direction (direction along the long side in FIG. 1) but has sensitivity to a magnetic field in a second direction (direction along the short side in FIG. 1). The sensitivity of the magnetoresistive effect element Mr0 is maximum to the magnetic field in the second direction.

The pair of first magnetoresistive effect elements 1P and 1Q and the pair of third magnetoresistive effect elements 3P and 3Q are arranged to have sensitivity to a magnetic field in a direction along the X-axis. The pair of first magnetoresistive effect elements 1P and 1Q and the pair of third magnetoresistive effect elements 3P and 3Q cause a resistance variation in the same pattern to the magnetic field aligned with the positive direction of the X-axis and the magnetic field aligned with the negative direction of the X-axis if the two magnetic fields have the same magnitude.

The pair of second magnetoresistive effect elements 2P and 2Q and the pair of fourth magnetoresistive effect elements 4P and 4Q are disposed to have sensitivity to a magnetic field in a direction along the Y-axis. The pair of second magnetoresistive effect elements 2P and 2Q and the pair of fourth magnetoresistive effect elements 4P and 4Q cause a resistance variation in the same pattern to the magnetic field aligned with the positive direction of the Y-axis and the magnetic field aligned with the negative direction of the Y-axis if the two magnetic fields have the same magnitude.

When viewed in the Z-axis direction, the magnetoresistive effect element Mr0 are arranged as indicated below with respect to the center of the magnetic sensor 100. That is, the first magnetoresistive effect element 1P and the third magnetoresistive effect element 3P are disposed on a positive side of the Y-axis from the center. The first magnetoresistive effect element 1Q and the third magnetoresistive effect element 3Q are disposed on a negative side of the Y-axis from the center. The second magnetoresistive effect element 2P and the fourth magnetoresistive effect element 4P are disposed on a positive side of the X-axis from the center. The second magnetoresistive effect element 2Q and the fourth magnetoresistive effect element 4Q are disposed on a negative of the X-axis from the center.

As described above, the Z coordinate of each of the four magnetic poles 50 shown in FIG. 1 is greater than the Z coordinate of each of the remaining four magnetic poles 50. That is, of the plurality of magnetic poles 50 of the bias magnet 5, the four magnetic poles 50 shown in FIG. 1 face the plurality of magnetoresistive effect elements Mr0 and apply a bias magnetic field to the plurality of magnetoresistive effect elements Mr0. In FIG. 1, the orientation of the bias magnetic field is indicated by an arrow.

To the first magnetoresistive effect element 1P and the third magnetoresistive effect element 3P, The bias magnetic field aligned with the positive direction of the X-axis is applied. To the first magnetoresistive effect element 1Q and the third magnetoresistive effect element 3Q, the bias magnetic field aligned with the negative direction of the X-axis is applied.

To the second magnetoresistive effect element 2P and the fourth magnetoresistive effect element 4P, the bias magnetic field aligned with the positive direction of the Y-axis is applied. To the second magnetoresistive effect element 2Q and the fourth magnetoresistive effect element 4Q, the bias magnetic field aligned with the negative direction of the Y-axis is applied.

Thus, the single bias magnet 5 generates the bias magnetic field aligned with the positive direction of the X-axis and the bias magnetic field aligned with the negative direction of the X-axis. Moreover, the single bias magnet 5 generates the bias magnetic field aligned with the positive direction of the Y-axis and the bias magnetic field aligned with the negative direction of the Y-axis.

Figure 7:
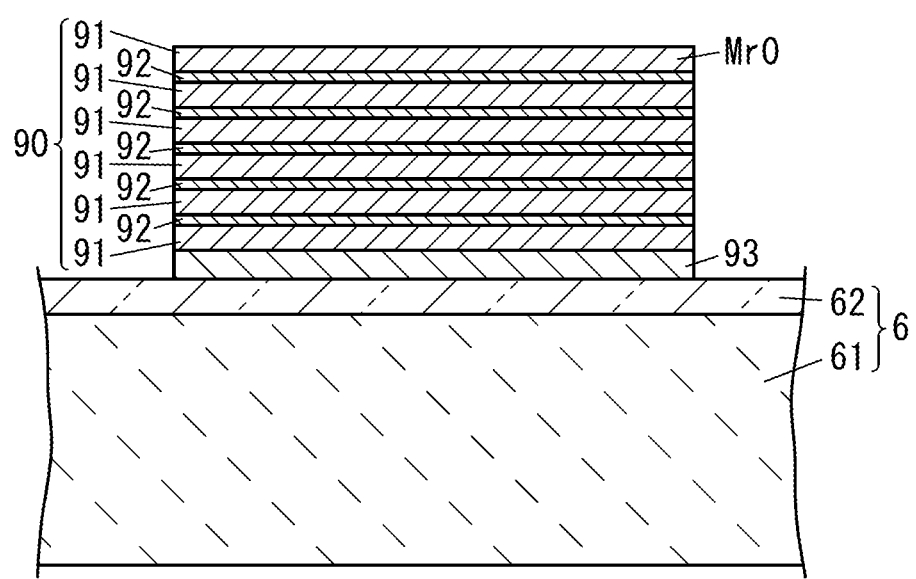
FIG. 7 is a cross-sectional view of a magnetoresistive effect element of the magnetic sensor.

The magnetoresistive effect element Mr0 is a giant magnetoresistance (GMR) element. More specifically, the magnetoresistive effect element Mr0 is a current-in-plane (CIP) type GMR element. As shown in FIG. 7, the magnetoresistive effect element Mr0 includes a multilayer stack 90 and an undercoat layer 93.

The multilayer stack 90 is formed by alternately stacking, one on top of another, a plurality of magnetic layers 91, each containing NiFeCo as a component, and a plurality of non-magnetic layers 92, each containing Cu as a component. Such a structure enables providing a high-output magnetoresistive effect element Mr0. The number of layers of the multilayer stack 90 may be, for example, either greater than or equal to 10 or greater than or equal to 20. The magnetic layer 91 is a layer of a ferromagnetic material. The magnetic layer 91 is magnetized more easily than the non-magnetic layer 92. The non-magnetic layer 92 preferably contains Cu only.

As shown in FIG. 7, the magnetic sensor 100 includes a substrate layer 6. The substrate layer 6 is included in the wiring layer W1 (see FIG. 3). The substrate layer 6 includes a substrate 61 and a glazing layer 62. The glazing layer 62 is formed on a surface of the substrate 61. The glazing layer 62 includes, as a material, a glass material such as amorphous glass. The glazing layer 62 is formed by printing glass paste onto the surface of the substrate 61 and firing the glass paste. On a surface of the glazing layer 62, the magnetoresistive effect element Mr0 is formed.

The multilayer stack 90 is laid on top of the undercoat layer 93. More specifically, the undercoat layer 93 is formed on the surface of the glazing layer 62 of the substrate layer 6, and the multilayer stack 90 is formed on a surface of the undercoat layer 93. The undercoat layer 93 contains NiFeCr as a component thereof. Providing the undercoat layer 93 enables providing a high-output magnetoresistive effect element Mr0. In addition, providing the undercoat layer 93 allows crystal grains in the magnetic layer 91 to grow sufficiently, thus improving the heat resistance of the magnetoresistive effect element Mr0.

The magnetoresistive effect element Mr0 has no sensitivity in a predetermined direction but has sensitivity isotropically in a plurality of directions intersecting with the predetermined direction.

The bias magnet 5 applies a magnetic field (bias magnetic field) having a field strength of less than or equal to one half field strength of an anisotropic magnetic field of each of the plurality of magnetoresistive effect elements Mr0 to each of the plurality of (eight) magnetoresistive effect elements Mr0 including the pair of first magnetoresistive effect elements 1P and 1Q and the pair of second magnetoresistive effect elements 2P and 2Q. This enables reducing the distortion of an output waveform of each of the plurality of magnetoresistive effect elements Mr0.

(6) Protection Film

As shown in FIG. 3, the first protection film 71 covers the wiring layer W1. The bias magnet 5 is mounted on a surface of the first protection film 71. The second protection film 72 covers the bias magnet 5.

The first protection film 71 is made of, for example, a resin, a metal oxide such as $Al_2O_3$ (alumina), or a metal nitride. The second protection film 72 is made of, for example, a resin.

(7) Processing Circuit

The processing circuit 201 (refer to FIG. 1) includes a computer system including one or more processors and a memory. The functions of the processing circuit 201 are performed by making the processor of the computer system execute a program stored in the memory of the computer system. The program may be stored in the memory. Alternatively, the program may also be downloaded via a telecommunications network such as the Internet or distributed after having been stored in a non-transitory storage medium such as a memory card.

The processing circuit 201 determines, based on the first, second, third, and fourth output signals, the orientation of the magnetic field applied to the magnetic sensor 100. The first output signal, the second output signal, the third output signal, and the fourth output signal are respectively output from the first output terminal 1T, the second output terminal 2T, the third output terminal 3T, and the fourth output terminal 4T. In other words, the first output signal, the second output signal, the third output signal, and the fourth output signal are respectively output from the first half-bridge circuit 1, the second half-bridge circuit 2, the third half-bridge circuit 3, and the fourth half-bridge circuit 4.

Comparing the first half-bridge circuit 1 and the third half-bridge circuit 3 with each other, it can be seen that the two half-bridge circuits 1 and 3 have the same sensitivity direction of the magnetoresistive effect elements Mr0 and the same orientation of the bias magnetic fields but that the arrangement of the magnetoresistive effect elements Mr0 on the higher- and lower-potential sides in one of these two half-bridge circuits 1 and 3 is opposite from the arrangement in the other half-bridge circuit 3 and 1 as shown in FIGS. 1 and 5. Thus, the third output signal has a reverse phase with respect to the first output signal.

Comparing the second half-bridge circuit 2 and the fourth half-bridge circuit 4 with each other, it can be seen that the two half-bridge circuits 2 and 4 have the same sensitivity direction of the magnetoresistive effect elements Mr0 and the same orientation of the bias magnetic fields but that the arrangement of the magnetoresistive effect elements Mr0 on the higher- and lower-potential sides in one of these two half-bridge circuits 2 and 4 is opposite from the arrangement in the other half-bridge circuit 4 and 2 as shown in FIGS. 1 and 6. Thus, the fourth output signal has a reverse phase with respect to the second output signal.

(8) Detection of Magnetic Field Orientation

The magnetic sensor 100 is disposed in the vicinity of the rotor 8. The plurality of magnetic poles 80 of the rotor 8 form a magnetizing field. As the rotor 8 rotates, the orientation of the magnetic field applied to the magnetic sensor 100 changes. The processing circuit 201 determines, based on an output of the magnetic sensor 100, the orientation of the magnetic field applied to the magnetic sensor 100.

Note that supposing that not the rotor 8 but the magnetic sensor 100 rotates with respect to the rotor 8, the orientation of the magnetic field applied to the magnetic sensor 100 also changes as the magnetic sensor 100 rotates, and the processing circuit 201 may also determine the orientation of the magnetic field. Thus, in the following description, a situation where the rotor 8 is fixed and the magnetic sensor 100 changes its position in the order of L1, L2, L3, L4, and L5 will be described with reference to FIG. 4. The magnetic sensor 100 rotates around the rotor 8, and therefore, the X-axis and the Y-axis also rotate accordingly.

At each of the positions L1, L2, L3, L4, and L5, the magnetic sensor 100 is located radially outside of the rotor 8. In this case, the orientation of the magnetic field applied to the magnetic sensor 100 is perpendicular to the direction defined by a rotational axis of the rotor 8. Thus, the orientation of the magnetic sensor 100 needs to be adjusted to make the Z-axis defined for the magnetic sensor 100 aligned with the direction of the rotational axis of the rotor 8.

Figure 8:
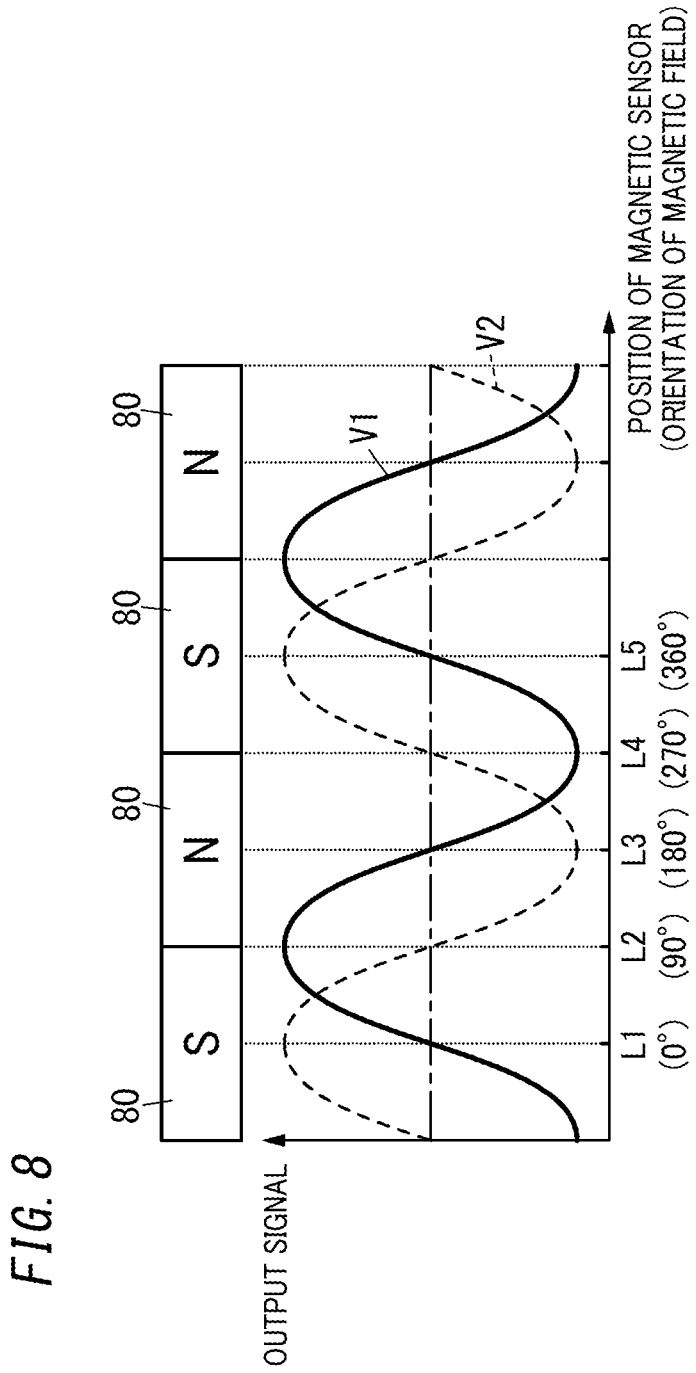
FIG. 8 shows output signals of the magnetic sensor.

As the magnetic sensor 100 changes its position in the order of L1, L2, L3, L4, and L5 (actually, as the rotor 8 rotates), each of the first, second, third, and fourth output signals changes in either a sinusoidal wave or a cosine wave. FIG. 8 shows a waveform V1 of the first output signal and a waveform V2 of the second output signal. The third output signal is a signal having a reverse phase with respect to the first output signal. The fourth output signal is a signal having a reverse phase with respect to the second output signal. Thus, illustration of the third and fourth output signal is omitted from FIG. 8. In FIG. 8, the plurality of magnetic poles 80 are illustrated as straight ones for the sake of convenience.

When the magnetic sensor 100 is located at the position L3 where the magnetic sensor 100 faces the center of one of N-magnetic poles 80 of the rotor 8, a magnetic field aligned with the positive direction of the Y-axis is applied to the magnetic sensor 100. The pair of first magnetoresistive effect elements 1P and 1Q and the pair of third magnetoresistive effect elements 3P and 3Q detect no magnetic field. The bias magnetic field aligned with the positive direction of the Y-axis is applied to the second magnetoresistive effect element 2P and the fourth magnetoresistive effect element 4P, and therefore, the magnetic field of the rotor 8 and the bias magnetic field enhance each other. On the other hand, the bias magnetic field aligned with the negative direction of the Y-axis is applied to the second magnetoresistive effect element 2Q and the fourth magnetoresistive effect element 4Q, and therefore, the magnetic field of the rotor & and the bias magnetic field attenuate each other.

Therefore, when the magnetic sensor 100 is at the position L3, the second output signal is minimum and the fourth output signal is maximum.

When the magnetic sensor 100 is located at the position L1, L5 where the magnetic sensor faces the center of one of S-magnetic poles 80 of the rotor 8, the orientation of the magnetic field of the rotor 8 is opposite to the orientation in the case of the magnetic sensor 100 being at the position L3, and therefore, the second output signal is maximum and the fourth output signal is minimum.

When the magnetic sensor 100 is located at the position L2 where the magnetic sensor 100 faces a boundary between an N-magnetic pole 80 and an S-magnetic pole 80 of the rotor 8, a magnetic field aligned with the positive direction of the X-axis is applied to the magnetic sensor 100. The pair of second magnetoresistive effect elements 2P and 2Q and the pair of fourth magnetoresistive effect elements 4P and 4Q detect no magnetic field. The bias magnetic field aligned with the positive direction of the X-axis is applied to the first magnetoresistive effect element 1P and the third magnetoresistive effect element 3P, and therefore, the magnetic field of the rotor 8 and the bias magnetic field enhance each other. On the other hand, the bias magnetic field aligned with the negative direction of the X-axis is applied to the first magnetoresistive effect element 1Q and the third magnetoresistive effect element 3Q, and therefore, the magnetic field of the rotor 8 and the bias magnetic field attenuate each other.

Thus, when the magnetic sensor 100 is located at the position L2, the first output signal is maximum and the third output signal is minimum.

The rotor 8 has a plurality of boundaries each between an N-magnetic pole 80 and an S-magnetic pole 80 in a circumferential direction. When the magnetic sensor 100 is located at the position L4 where the magnetic sensor 100 next faces a boundary between an N-magnetic pole 80 and an S-magnetic pole 80 after the position L2, the orientation of the magnetic field of the rotor 8 is opposite to the orientation in the case where the magnetic sensor 100 is located at the position L2, and therefore, the first output signal is minimum and the third output signal is maximum.

As shown in FIG. 8, every time a relative rotational angle of the magnetic sensor 100 with respect to the rotor 8 changes by a rotational angle corresponding to double the width of each magnetic pole 80, the first and second output signals will repeat the same waveform. In other words, the rotational angle corresponding to double the width of each magnetic pole 80 corresponds to one cycle of each of the first and second output signals.

Supposing the first and second output signals are each a sinusoidal wave, the phase difference between the first and second output signals is a rotational angle corresponding to one half the width of each magnetic pole 80. That is to say, the phase difference is a quarter of one cycle. Therefore, supposing the first output signal is a sinusoidal wave, the second output signal will be a cosine wave with respect to the first output signal.

For example, the processing circuit 201 derives, based on the first and second output signals, a common phase between the first output signal as a sinusoidal wave and the second output signal as a cosine wave. The processing circuit 201 may decide that every time the phase has changed by one cycle, the magnetic sensor 100 (actually, the rotor 8) have rotated to a rotational angle corresponding to one cycle. In other words, the processing circuit 201 may decide that every time the phase has changed by one cycle, the magnetic sensor 100 (actually, the rotor 8) have rotated to a rotational angle corresponding to double the width of each magnetic pole 80. In this manner, the processing circuit 201 may determine how much the magnetic sensor 100 (actually the rotor 8) has rotated from the rotational angle at the starting point. That is to say, the processing circuit 201 may determine a relative rotational angle.

Also, the phases of the first and second output signals correspond to the orientation of the magnetic field applied to the magnetic sensor 100. That is to say, the processing circuit 201 may determine the orientation of the magnetic field applied to the magnetic sensor 100. More specifically, the processing circuit 201 may determine the orientation of the magnetic field applied to the magnetic sensor 100 within a range of 0 degrees to 360 degrees.

In another example, the processing circuit 201 may determine, based on not only the first and second output signals but also the third and fourth output signals, the rotational angle of the magnetic sensor 100 (actually the rotor 8). Specifically, the processing circuit 201 generates a first differential signal representing the difference between the first output signal and the third output signal. The first differential signal has a waveform, of which the amplitude is double the amplitude of the first output signal. In addition, the processing circuit 201 also generates a second differential signal representing the difference between the second output signal and the fourth output signal. The second differential signal has a waveform, of which the amplitude is double the amplitude of the second output signal. The processing circuit 201 derives, based on the first and second differential signals, a common phase between the first differential signal as a sinusoidal wave and the second differential signal as a cosine wave. The processing circuit 201 may decide that every time the phase has changed by one cycle, the magnetic sensor 100 (actually, the rotor 8) have rotated to a rotational angle corresponding to one cycle. The amplitude of the first and second differential signals is double the amplitude of the first and second output signals, thus allowing the orientation of the magnetic field and the rotational angle of the magnetic sensor 100 (actually the rotor 8) to be determined more accurately.

Optionally, the magnetic detection system 200 may include a sensor (such as an optical sensor or a magnetic sensor) for detecting the starting point of movement (e.g., rotation) of the target of measurement (e.g., the rotor 8 in this case). Every time the target of measurement makes one full rotation, the sensor generates a predetermined output signal and the processing circuit 201 detects the starting point based on the predetermined output signal.

(First Variation)

A first variation of the embodiment will be described below. In the following description, any constituent element of this first variation, having the same function as a counterpart of the embodiment described above, will be designated by the same reference numeral as that counterpart's, and description thereof will be omitted herein.

In the embodiment described above with reference to FIG. 4, the magnetic sensor 100 is disposed outside of the circumference of the rotor 8. However, this is only an example and should not be construed as limiting. Alternatively, the magnetic sensor 100 may also be disposed at a position L41 (refer to FIG. 4), for example. That is to say, the magnetic sensor 100 may also be disposed at a position where the magnetic sensor 100 faces the rotor 8 in a direction parallel to the rotational axis of the rotor 8. Even in that case, as the rotor 8 rotates, the magnetic field applied to the magnetic sensor 100 also rotates to allow the magnetic sensor 100 to detect the orientation of the magnetic field.

In that case, however, the orientation of the magnetic sensor 100 needs to be different from that of the embodiment described above. The orientation of the magnetic field applied to the magnetic sensor 100 will be perpendicular to the radial direction of the rotor 8. Thus, the orientation of the magnetic sensor 100 needs to be adjusted such that the Z-axis defined for the magnetic sensor 100 is aligned with the radial direction of the rotor 8.

Other Variations of Embodiment

Next, other variations of the embodiment will be enumerated one after another. Note that the variations to be described below may be adopted in combination as appropriate. Optionally, the variations to be described below may also be adopted as appropriate in combination with the first variation described above.

The magnetic sensor 100 does not have to be used to detect the rotational angle of the target of detection. Alternatively, the magnetic sensor 100 may also be used to detect a linear movement of a target of detection.

The target of detection does not have to be the rotor 8. Optionally, the target of detection and an object that generates magnetism to be detected by the magnetic sensor 100 may be formed separately from each other and then attached to each other.

The magnetic sensor 100 does not have to be used to determine the rotational angle but only needs to be used to detect the orientation of the magnetic field.

The reference terminal L20 electrically connected to the first magnetoresistive effect element 1P and the reference terminal L20 electrically connected the fourth magnetoresistive effect element 4P may be separate terminals. Similarly, the reference terminal L10 and the power supply terminals H10 and H20 may be individually disposed for each magnetoresistive effect element Mr0.

Optionally, the third half-bridge circuit 3 and the fourth half-bridge circuit 4 may be omitted from the magnetic sensor 100. In that case, the processing circuit 201 may determine the orientation of the magnetic field applied to the magnetic sensor 100 based on the first and second output signals, instead of the first differential signal representing the difference between the first and third output signals and the second differential signal representing the difference between the second and fourth output signals.

In the magnetic sensor 100, the first protection film 71 and the second protection film 72 may be omitted.

The number of the bias magnet 5 is not limited to one, but two or more bias magnets 5 may be provided.

The number of magnetic poles 50 of the bias magnet 5 is not limited to eight, but, for example, two or four magnetic poles 50 may be provided.

(Recapitulation)

The embodiment and its variations described above are specific implementations of the following aspects of the present disclosure.

A magnetic sensor (100) of a first aspect includes at least one bias magnet (5), a first half-bridge circuit (1), a second half-bridge circuit (2), and a base member (73). The at least one bias magnet (5) is configured to generate a bias magnetic field aligned with a positive direction of an X-axis, a bias magnetic field aligned with a negative direction of the X-axis, a bias magnetic field aligned with a positive direction of a Y-axis orthogonal to the X-axis, and a bias magnetic field aligned with a negative direction of the Y-axis. The base member (73) holds the at least one bias magnet (5), the first half-bridge circuit (1), and the second half-bridge circuit (2). The first half-bridge circuit (1) includes a pair of first magnetoresistive effect elements (1P, 1Q) half-bridge connected to each other and configured to detect a magnetic field aligned with the X-axis and a first output terminal (1T) configured to output a first output signal from a connection point between the pair of first magnetoresistive effect elements (1P, 1Q). The second half-bridge circuit (2) includes a pair of second magnetoresistive effect elements (2P, 2Q) half-bridge connected to each other and configured to detect a magnetic field aligned with the Y-axis and a second output terminal (2T) configured to output a second output signal from a connection point between the pair of second magnetoresistive effect elements (2P, 2Q). The bias magnetic field aligned with the positive direction of the X-axis is applied to one of the pair of first magnetoresistive effect elements (1P, 1Q), and the bias magnetic field aligned with the negative direction of the X-axis is applied to the other of the pair of first magnetoresistive effect elements (1P, 1Q). The bias magnetic field aligned with the positive direction of the Y-axis is applied to one of the pair of second magnetoresistive effect elements (2P, 2Q), and the bias magnetic field aligned with the negative direction of the Y-axis is applied to the other of the pair of second magnetoresistive effect elements (2P, 2Q).

This configuration causes the first output signal delivered as the magnetic field applied to the magnetic sensor (100) rotates to have a waveform close to an ideal sinusoidal wave and causes the second output signal to have a waveform close to an ideal cosine wave. This makes it accurate to determine, based on the first output signal and the second output signal, the orientation of the magnetic field applied to the magnetic sensor (100).

In a magnetic sensor (100) of a second aspect referring to the first aspect, the at least one bias magnet (5) includes a single bias magnet (5) configured to generate the bias magnetic field aligned with the positive direction of the X-axis and the bias magnetic field aligned with the negative direction of the X-axis.

This configuration, as compared with the case where a bias magnet for generating a bias magnetic field aligned with the positive direction of the X-axis and a bias magnet for generating a bias magnetic field aligned with the negative direction of the X-axis are individually provided, reduces an angle error between the two bias magnetic fields. This enables reducing the distortion of the waveform of the first output signal.

In a magnetic sensor (100) of a third aspect referring the second aspect, the at least one bias magnet (5) includes a single bias magnet (5) configured to generate the bias magnetic field aligned with the positive direction of the X-axis, the bias magnetic field aligned with the negative direction of the X-axis, the bias magnetic field aligned with the positive direction of the Y-axis, and the bias magnetic field aligned with the negative direction of the Y-axis.

This configuration enables, as compared with the case where four bias magnets are provided in accordance with four bias magnetic fields, reducing an angular error among the four bias magnetic fields. This enables reducing the distortion of the waveforms of the first output signal and the second output signal.

In a magnetic sensor (100) of a fourth aspect referring to any one of the first to third aspects, among the pair of first magnetoresistive effect elements (1P, 1Q) or the pair of second magnetoresistive effect elements (2P, 2Q), at least one magnetoresistive effect element (Mr0) includes a multilayer stack (90) formed by alternately stacking, one on top of another, magnetic layers (91) containing NiFeCo as a component and non-magnetic layers (92) containing Cu as a component.

This configuration contributes to increasing the output of the magnetoresistive effect element (Mr0).

In a magnetic sensor (100) of a fifth aspect referring to the fourth aspect, the at least one magnetoresistive effect element (Mr0) includes an undercoat layer (93) containing NiFeCr as a component and the multilayer stack (90) laid on top of the undercoat layer (93).

This configuration contributes to increasing the output of the magnetoresistive effect element (Mr0)).

In a magnetic sensor (100) of a sixth aspect referring to any one of the first to fifth aspects, the at least one bias magnet (5) is configured to apply, to each of a plurality of magnetoresistive effect elements (Mr0) including the pair of first magnetoresistive effect elements (1P, 1Q) and the pair of second magnetoresistive effect elements (2P, 2Q), a magnetic field having a field strength of less than or equal to one half field strength of an anisotropic magnetic field of the each of the plurality of magnetoresistive effect elements (Mr0).

This configuration may reduce the distortion of the waveforms of the first output signal and the second output signal.

A magnetic sensor (100) of a seventh aspect referring to any one of the first to sixth aspects further includes a third half-bridge circuit (3) and a fourth half-bridge circuit (4). The third half-bridge circuit (3) is configured to output a third output signal having a reverse phase with respect to the first output signal. The fourth half-bridge circuit (4) is configured to output a fourth output signal having a reverse phase with respect to the second output signal.

This configuration enables the output to be approximately doubled by deriving a differential output between the first output signal and the third output signal, as compared with the first output signal. Similarly, this configuration enables the output to be approximately doubled by deriving a differential output between the second output signal and the fourth output signal, as compared with the second output signal. This enables the orientation of the magnetic field to be more accurately determined based on the differential output.

Note that the constituent elements according to the second to seventh aspects are not essential constituent elements for the magnetic sensor (100) but may be omitted as appropriate.

A magnetic detection system (200) of an eighth aspect includes the magnetic sensor (100) according to any one of the first to seventh aspects and a processing circuit (201). The processing circuit (201) is configured to determine, based on at least the first output signal and the second output signal, an orientation of a magnetic field applied to the magnetic sensor (100).

This configuration may provide a magnetic detection system (200) including a processing circuit (201) as an integral part thereof.

REFERENCE SIGNS LIST

1 First Half-Bridge Circuit
1P, 1Q First Magnetoresistive Effect Element
2 Second Half-Bridge Circuit
2P, 2Q Second Magnetoresistive Effect Element 3 Third Half-Bridge Circuit
4 Fourth Half-Bridge Circuit
5 Bias Magnet
73 Base Member
90 Multilayer Stack
91 Magnetic Layer
92 Non-Magnetic Layer
93 Undercoat Layer
100 Magnetic Sensor
200 Magnetic Detection System
201 Processing Circuit
Mr0 Magnetoresistive Effect Element
1T First Output Terminal
2T Second Output Terminal

The invention claimed is:

1. A magnetic sensor comprising:
at least one bias magnet configured to generate a bias magnetic field aligned with a positive direction of an X-axis, a bias magnetic field aligned with a negative direction of the X-axis, a bias magnetic field aligned with a positive direction of a Y-axis orthogonal to the X-axis, and a bias magnetic field aligned with a negative direction of the Y-axis;
a first half-bridge circuit;
a second half-bridge circuit; and
a base member holding the at least one bias magnet, the first half-bridge circuit, and the second half-bridge circuit,
the first half-bridge circuit including
a pair of first magnetoresistive effect elements half-bridge connected to each other and configured to detect a magnetic field aligned with the X-axis and
a first output terminal configured to output a first output signal from a connection point between the pair of first magnetoresistive effect elements,
the second half-bridge circuit including
a pair of second magnetoresistive effect elements half-bridge connected to each other and configured to detect a magnetic field aligned with the Y-axis and
a second output terminal configured to output a second output signal from a connection point between the pair of second magnetoresistive effect elements,
the bias magnetic field aligned with the positive direction of the X-axis being applied to one of the pair of first magnetoresistive effect elements,
the bias magnetic field aligned with the negative direction of the X-axis being applied to the other of the pair of first magnetoresistive effect elements,
the bias magnetic field aligned with the positive direction of the Y-axis being applied to one of the pair of second magnetoresistive effect elements,
the bias magnetic field aligned with the negative direction of the Y-axis being applied to the other of the pair of second magnetoresistive effect elements.

2. The magnetic sensor of claim 1, wherein
the at least one bias magnet includes a single bias magnet configured to generate the bias magnetic field aligned with the positive direction of the X-axis and the bias magnetic field aligned with the negative direction of the X-axis.

3. The magnetic sensor of claim 2, wherein
the at least one bias magnet includes a single bias magnet configured to generate the bias magnetic field aligned with the positive direction of the X-axis, the bias magnetic field aligned with the negative direction of the X-axis, the bias magnetic field aligned with the positive direction of the Y-axis, and the bias magnetic field aligned with the negative direction of the Y-axis.

4. The magnetic sensor of claim 1, wherein
among the pair of first magnetoresistive effect elements or the pair of second magnetoresistive effect elements, at least one magnetoresistive effect element includes a multilayer stack formed by alternately stacking, one on top of another, magnetic layers containing NiFeCo as a component and non-magnetic layers containing Cu as a component.

5. The magnetic sensor of claim 4, wherein
the at least one magnetoresistive effect element includes an undercoat layer containing NiFeCr as a component and
the multilayer stack laid on top of the undercoat layer.

6. The magnetic sensor of claim 1, wherein
the at least one bias magnet is configured to apply, to each of a plurality of magnetoresistive effect elements including the pair of first magnetoresistive effect elements and the pair of second magnetoresistive effect elements, a magnetic field having a field strength of less than or equal to one half filed strength of an anisotropic magnetic field of the each of the plurality of magnetoresistive effect elements.

7. The magnetic sensor of claim 1, further comprising:
a third half-bridge circuit configured to output a third output signal having a reverse phase with respect to the first output signal; and
a fourth half-bridge circuit configured to output a fourth output signal having a reverse phase with respect to the second output signal.

8. A magnetic detection system comprising:
the magnetic sensor of claim 1; and
a processing circuit configured to determine, based on at least the first output signal and the second output signal, an orientation of a magnetic field applied to the magnetic sensor.

* * * * *